United States Patent
Sawada et al.

(10) Patent No.: US 6,424,091 B1
(45) Date of Patent: Jul. 23, 2002

(54) PLASMA TREATMENT APPARATUS AND PLASMA TREATMENT METHOD PERFORMED BY USE OF THE SAME APPARATUS

(75) Inventors: Yasushi Sawada; Kosuke Nakamura, both of Neyagawa; Hiroaki Kitamura, Moriguchi; Yoshitami Inoue, Neyagawa, all of (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 09/421,291

(22) Filed: Oct. 20, 1999

(30) Foreign Application Priority Data

Oct. 26, 1998 (JP) ............................................. 10-304003

(51) Int. Cl.⁷ ............................ H01J 7/24; H05B 31/26
(52) U.S. Cl. ............................... 315/111.81; 118/723 I; 118/723 AN; 315/111.21
(58) Field of Search ........................ 315/111.21, 111.31, 315/111.81; 118/723 I, 723 MV, 723 AN (56) References Cited

U.S. PATENT DOCUMENTS

| | | | |
|---|---|---|---|
| 5,185,132 A | 2/1993 | Horiike et al. | 422/186.05 |
| 5,369,336 A | 11/1994 | Koinuma et al. | 315/111.21 |
| 5,387,842 A * | 2/1995 | Roth et al. | 315/111.21 |

FOREIGN PATENT DOCUMENTS

| | | |
|---|---|---|
| EP | 0 431 951 | 6/1991 |
| JP | 2-15171 | 1/1990 |
| JP | 3-219082 | 9/1991 |
| JP | 3-241739 | 10/1991 |
| JP | 4-212253 | 8/1992 |
| JP | 4-358076 | 12/1992 |
| JP | 6-108257 | 4/1994 |
| JP | 2657850 | 6/1997 |
| WO | WO 94/28568 | 12/1994 |
| WO | WO 98/32154 | 7/1998 |

* cited by examiner

Primary Examiner—Michael B. Shingleton
(74) Attorney, Agent, or Firm—Rader, Fishman & Grauer (57) ABSTRACT

A plasma treatment apparatus capable of efficiently performing a plasma treatment to a large area of an object while preventing the occurrence of streamer discharge is provided. The apparatus includes at least one pair of electrodes, gas supply unit for supplying a gas for plasma generation to a discharge space defined between the electrodes, and an electric power supply for applying an AC voltage between the electrodes to generate plasma of the gas for plasma generation in the discharge space. At least one of the pair of electrodes has a dielectric layer at an outer surface thereof. At least one of the pair of electrodes has a curved surface jutting into the discharge space. It is preferred that the electrodes are of a cylindrical structure. In this case, it is particularly preferred that the plasma treatment apparatus further includes a coolant supply unit for supplying a coolant to the interior of the electrodes to reduce an electrode temperature during the plasma treatment.

20 Claims, 9 Drawing Sheets

PLASMA TREATMENT APPARATUS AND PLASMA TREATMENT METHOD PERFORMED BY USE OF THE SAME APPARATUS

BACKGROUND OF THE INVENTION

1. Field of the Invention

The present invention relates to a plasma treatment apparatus, which can be used for removing foreign substances such as organic substances from objects to be treated, stripping resists, improving adhesion of organic films, surface modification, film formation, reducing metal oxides, or cleaning glass substrates for liquid crystal, and also a plasma treatment method performed by use of the same apparatus, which can be applied to clean surfaces of electronic parts requiring precise connections.

2. Disclosure of the Prior Art

In the past, surface treatments have been performed to substrates by use of plasma (glow discharge) stably generated under atmospheric pressure. For example, Japanese Patent Early Publication [KOKAI] No. 2-15171, No. 3-241739 or No. 1-306569 discloses a plasma treatment, which is characterized by arranging a pair of electrodes in a discharge space in a reaction vessel, disposing a dielectric material between the electrodes, filling the discharge space with a gas for plasma generation mainly composed of an inert gas such as He (helium) or Ar (argon), applying an AC voltage between the electrodes to generate plasma of the gas for plasma generation, and treating an object put in the reaction vessel with this plasma.

However, there are problems that it is difficult to perform the plasma treatment to only a selected area of the object, and the treatment time is too long. On this account, it is proposed to perform a plasma treatment by use of a plasma jet (particularly, radicals in plasma) generated by glow discharge under atmospheric pressure. For example, various kinds of methods are disclosed in Japanese Patent Early Publications [KOKAI] No. 4-358076, No. 3-219082, No. 4-212253 and No. 6-108257.

In each of the methods disclosed in Japanese Patent Early Publications [KOKAI] No. 3-219082, No. 4-212253 and No. 6-108257, a plasma jet is supplied from a nozzle-like reaction tube toward objects to be treated. However, this method still has room for improvement with respect to the following points.

(1) Since the treatment range is small, it is not suitable to treat large area.
(2) When the discharge space is narrowed, heat radiation properties lower and the interior of the reaction tube is heated at a high temperature, so that the objects to be treated easily suffer thermal damage. On the other hand, when the discharge space is enlarged, the treatment efficiency lowers.
(3) When the interior of the reaction tube is heated at such a high temperature, streamer discharge (arc discharge) easily occurs between the electrodes or between the reaction tube and the object. Therefore, it is not suitable to stably provide a uniform plasma treatment.

In addition, Japanese Patent Early Publication [KOKAI] No. 4-358076 discloses a plasma treatment apparatus having dielectric plates disposed between flat-panel electrodes. In this apparatus, there are problems that dimensions of the apparatus are large, and the treatment speed is slow because it is difficult to obtain a high plasma density from the reasons described below. That is, due to a large area of the flat-panel electrode, an electric power per unit volume of plasma lowers. By applying a larger electric power, the plasma density can be increased. However, the electrode is heated at a high temperature, so that the objects to be treated may suffer thermal damage, or a breakage of the electrodes or streamer discharge may occur. Moreover, in a method of putting the dielectric plate on the flat-panel electrode, it is difficult to reduce a thickness of the dielectric plate because of structural problems. As the structural problems, for example, when putting a glass plate as the dielectric plate on the electrode, it is difficult to adhere the glass plate having a thickness of less than 1 mm to the flat-panel electrode over the large area due to a poor strength of the glass plate. In addition, when using a ceramic plate as the dielectric plate, it is possible to produce the ceramic plate having a thin thickness and a sufficient strength. However, it is difficult to produce the ceramic plate having a large area corresponding to the flat-panel electrode, and also obtain good adhesion with the electrode material. Consequently, since a voltage drop is caused at the dielectric plate, it becomes difficult to increase the electric power per unit volume of plasma.

SUMMARY OF THE INVENTION

In view of the above points, a concern of the present invention is to provide a plasma treatment apparatus capable of efficiently performing a plasma treatment to a large area of an object placed at downstream from a discharge space, while preventing the occurrence of streamer discharge. The plasma treatment apparatus of the present invention comprises at least one pair of electrodes, a gas supply unit for supplying a gas for plasma generation to the discharge space defined between the electrodes, and a power supply for applying an AC voltage between the electrodes to generate plasma of the gas for plasma generation in the discharge space. At least one of the pair of electrodes has a dielectric layer at an outer surface thereof. In the present invention, at least one of the pair of electrodes has a curved surface jutting into the discharge space.

Using the electrode having the curved surface jutting into the discharge space is effective to increase a plasma density with the use of a reduced electric power while preventing the occurrence of streamer discharge. That is, when using an electrode having a sharp-pointed edge portion jutting into the discharge space, the plasma density can be increased. However, the streamer discharge (arc discharge) easily occurs at such an edge portion according to unevenness of electric field. Once the streamer discharge occurs, the plasma treatment can not be continued because the plasma (glow discharge) becomes unstable. In addition, when the streamer discharge occurs between the electrode and the object, there is a problem that the object suffers considerable thermal damage. When using the electrode having the curved surface jutting into the discharge space, it is possible to increase the plasma density and prevent the streamer discharge. In particular, it is preferred that a radius of curvature of the curved surface is within a range of 1 to 25 mm.

It is preferred that a plasma guide member is disposed adjacent to at least one of the pair of electrodes to guide the plasma such that the plasma spreads out toward the object from the discharge space. In addition, it is preferred that the plasma guide member is integrally formed with the electrode. The plasma guide member is useful to efficiently perform the plasma treatment to a large area of the object.

It is further preferred that at least one of the pair of electrodes is a tubular electrode, and more preferably a cylindrical electrode. In this case, it is particularly preferred that the plasma treatment apparatus includes a coolant supply unit for supplying a coolant to the interior of the tubular or cylindrical electrode to reduce an electrode temperature during the plasma treatment. Reducing the electrode temperature is effective to prevent the streamer discharge, as explained later in detail.

A further concern of the present invention is to provide a plasma treatment method performed by use of the plasma treatment apparatus described above. That is, the plasma treatment method comprises the steps of supplying the gas for plasma generation to the discharge space between electrodes, applying an AC voltage between the electrodes to generate plasma of the gas for plasma generation in the discharge space under atmospheric pressure, and treating the object with the plasma.

These and still other objects and advantages will become apparent from the following detail description of the invention and examples of the invention.

BRIEF EXPLANATION OF THE DRAWINGS

In FIGS. 4A and 4B.

DETAIL DESCRIPTION OF THE INVENTION

A preferred embodiment of the present invention is explained below.

Figure 1:
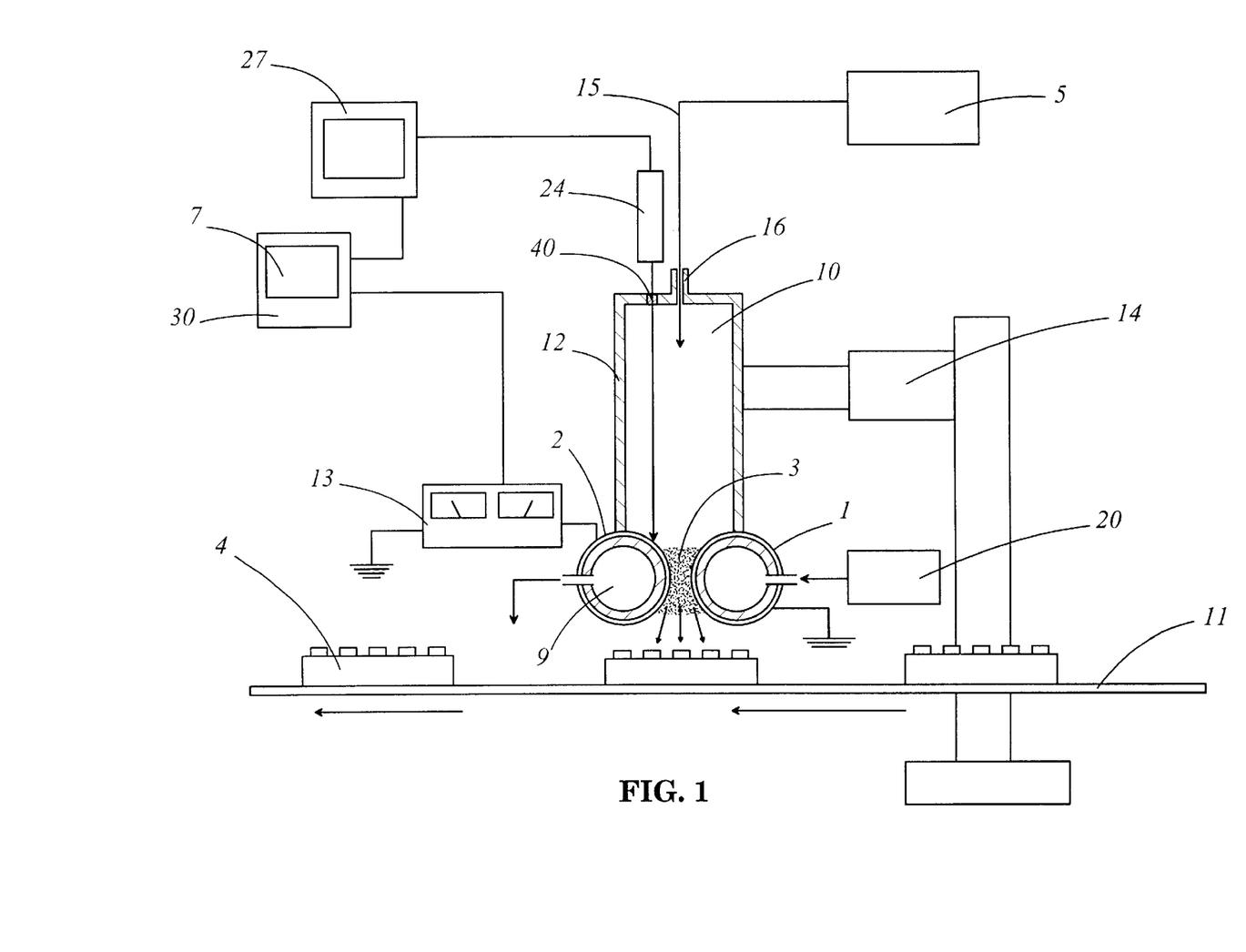
FIG. 1 is a schematic cross-sectional view showing an embodiment of a plasma treatment apparatus of the present invention.

As shown in FIG. 1, the plasma treatment apparatus is mainly composed of a plasma generator 10 for generating plasma 3, controller 7 and a conveyer 11 for conveying objects to be treated 4. The plasma generator 10 is formed with a pair of cylindrical (pipe-like) electrodes 1, 2, gas supply vessel 12, gas supply unit 5, AC power supply 13, coolant supply unit 20, thermometer 24 and a support member 14.

Figure 2:
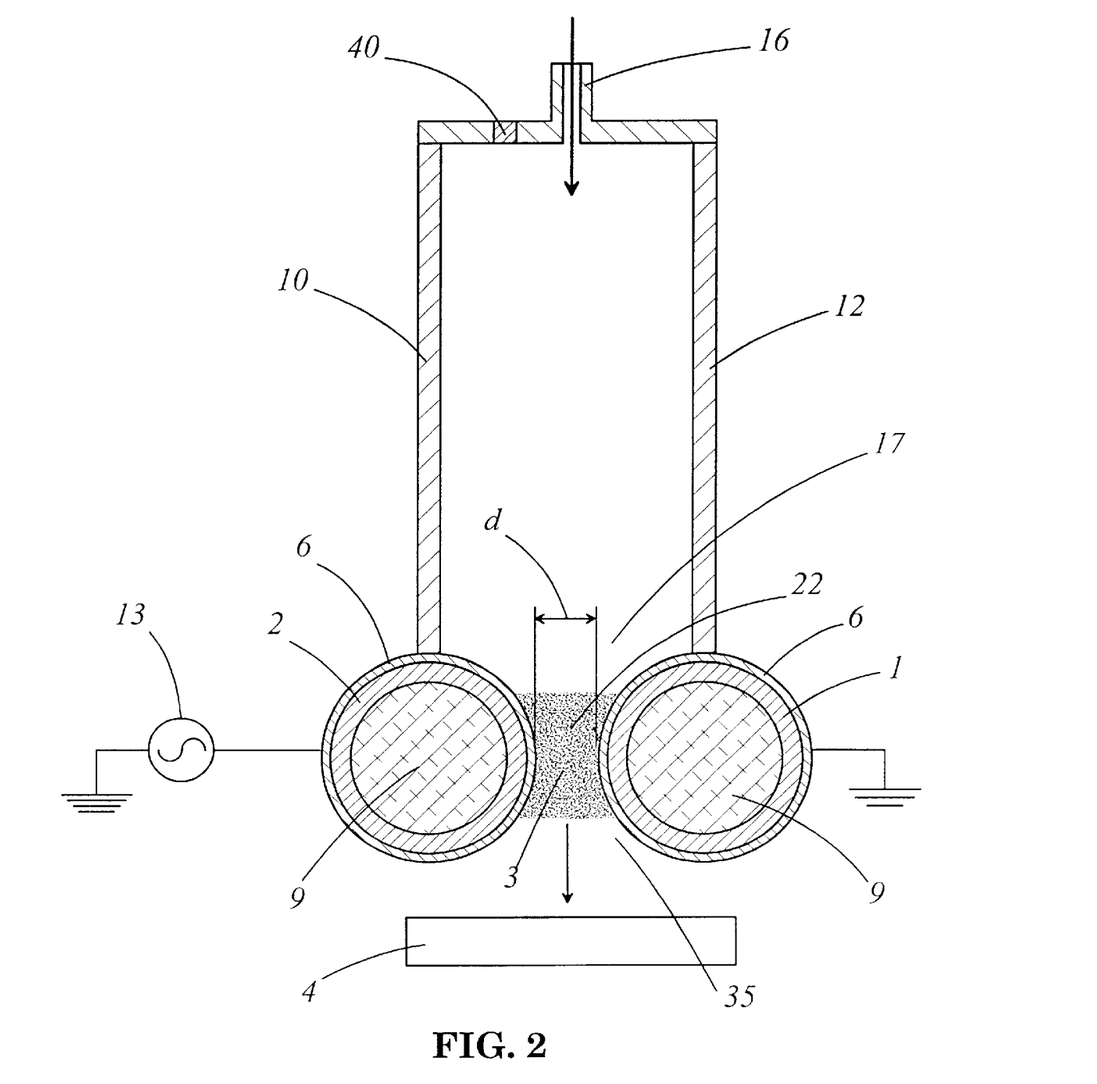
FIG. 2 is a schematic cross-sectional view showing a plasma generator of the plasma treatment apparatus of FIG. 1.
Figure 3:
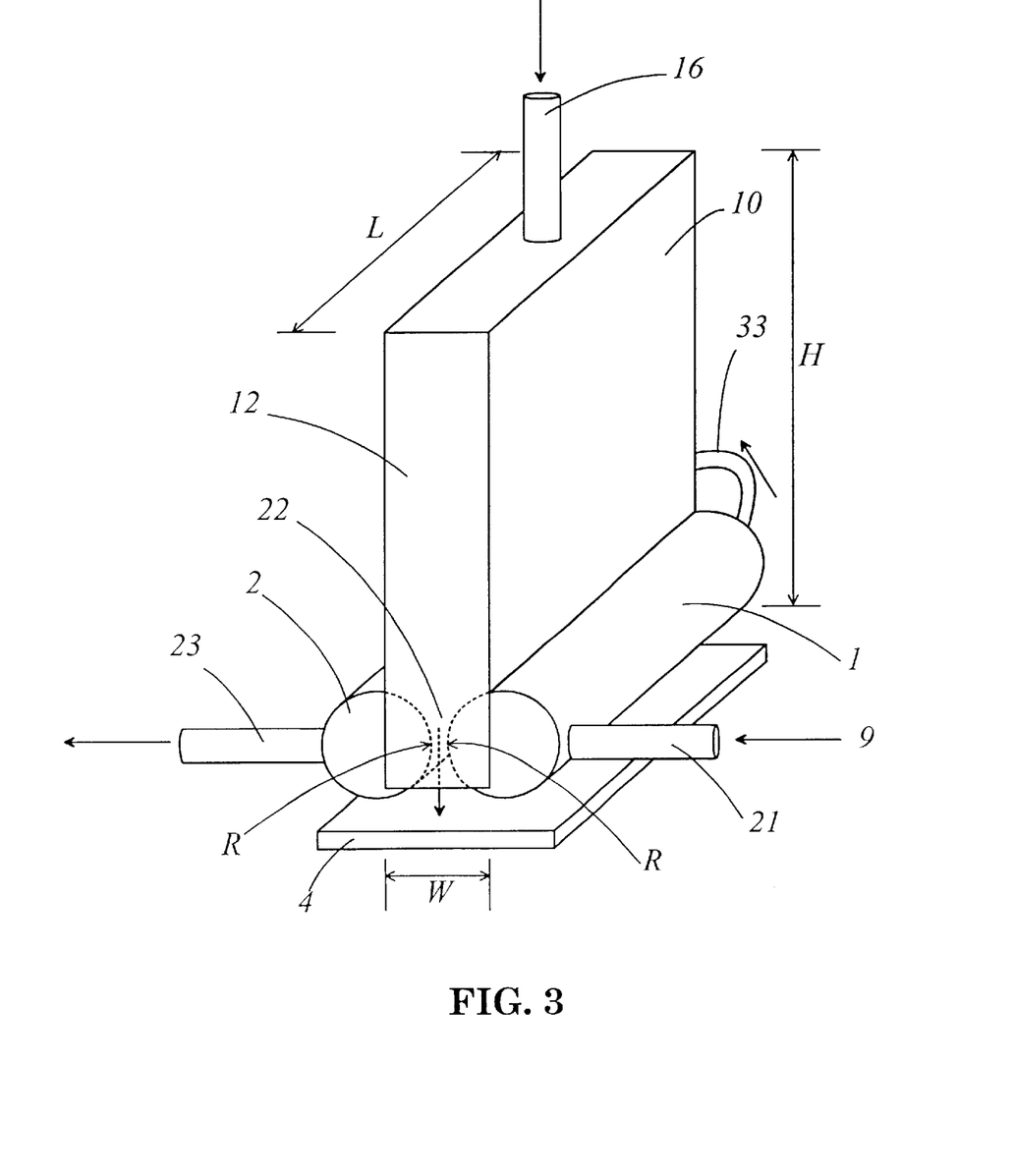
FIG. 3 is a perspective view showing the plasma generator of the plasma treatment apparatus of FIG. 1.

As shown in FIGS. 2 and 3, the cylindrical electrodes 1 and 2 are arranged such that the electrode 1 extends substantially parallel to the electrode 2, and the electrodes are spaced from each other by a predetermined distance d to define a discharge space 22 therebetween. It is preferred that the distance d between the electrodes 1 and 2 is in a range of 0.1 to 5 mm. The electrode 1 is grounded, and the electrode 2 is connected to the AC power source 13. In this apparatus, each of the electrodes has a curved surface R jutting into the discharge space 22. It is preferred that a radius of curvature of the curved surface R of the respective electrode (1, 2) is in a range of 1 to 25 mm. When the radius of curvature is less than 1 mm, the discharge space 22 becomes too small, so that the plasma 3 may not be efficiently generated. On the other hand, when the radius of curvature is more than 25 mm, the plasma 3 may not be generated to spread out toward the object 4 from the discharge space 22. In such a case, it may be difficult to efficiently treat a large area of the object 4 with the plasma 3. To improve heat radiation properties of the electrodes and insure uniform glow discharge, it is preferred that the electrodes 1, 2 are made of a material having excellent thermal conductivity. Concretely, it is possible to use copper, aluminum, brass, or a stainless steel having excellent corrosion resistance.

It is preferred that a surface roughness of an outer surface of the electrode is within a range of 10 to 1000 $\mu$m by arithmetic average roughness. When the surface roughness is expressed by an equation of y=f(x), the arithmetic average roughness Ra ($\mu$m) is defined by the following equation (1) according to JIS B 0601, $$Ra = \frac{1}{l}\int_0^l |f(x)|d(x), \tag{1}$$

wherein "l" shows a length of the electrode. When the surface roughness is less than 10 $\mu$m, the generation of plasma (glow discharge) may become difficult. On the other hand, when the surface roughness is more than 1000 $\mu$m, the plasma 3 may become unstable. The above range of the surface roughness is suitable to insure uniform glow discharge because it is believed that extremely fine microdischarges are generated, so that the occurrence of arc discharge is prevented. To obtain the required surface roughness of the electrodes 1, 2, for example, it is possible to use a physical treatment such as sandblast.

Each of the electrodes 1 and 2 has a dielectric layer 6 as an outer layer. The dielectric layer 6 is important to reduce a plasma temperature in the discharge space 22. It is preferred that the dielectric layer 6 is made of an insulation material having a dielectric constant of 2000 or less. When the dielectric constant is more than 2000, there is a possibility of causing a temperature rise of the plasma 3 although a magnitude of voltage applied between the electrodes 1 and 2 becomes large. There is no limitation as to a lower-limit value of the dielectric constant. As an example, the lower-limit value of the dielectric constant is 2. When the dielectric constant is less than 2, it is required to increase the AC voltage applied between the electrodes 1 and 2 to maintain the discharge. In this case, a power consumption amount in the discharge space increases, so that a temperature rise of the plasma 3 may occur. When either of the electrode 1 or 2 has the dielectric layer 6, it is preferred that the electrode having the dielectric layer is connected to the AC power supply 13.

To improve the stability of glow discharge, it is preferred to use a material having a high secondary-electron emission coefficient or a mixture thereof as the dielectric layer 6. As the material having a high secondary-electron emission coefficient, for example, it is possible to use MgO, MgF$_2$, $CaF_2$ or LiF. In particular, it is preferred to use MgO (magnesia) to maintain the stability. In case of using these materials as the dielectric layer 6, when ions in the plasma 3 collide with a surface of the dielectric layer 6, a large amount of secondary electrons are emitted from the surface of the dielectric layer. The emitted secondary electrons contribute to the stability of glow discharge. As the dielectric material containing magnesia, for example, it is possible to use a sintered body produced by preparing a mixture of a ceramic powder such as alumina and a small amount (0.01~5 vol %) of magnesia and sintering the mixture, or a material produced by flame-spraying the mixture on an electrode material. In addition, the dielectric material containing magnesia may be produced by coating a MgO film on a surface of a dielectric substrate such as alumina or quartz by means of sputtering, electron-beam deposition, or thermal spraying.

For example, the electrodes 1, 2 having the dielectric layer 6 can be formed according to a method comprising the steps of preparing a first cylinder made of an insulation material and a second cylinder made of the electrode material described above, and adhering the second cylinder to an inner surface of the first cylinder. Alternatively, it is possible to adopt a ceramic spraying method comprising the steps of dispersing a powder of alumina, magnesia, barium titanate, PZT or the like in plasma, and spraying the plasma on an outer surface of the second cylinder. In addition, it is possible to adopt a method of forming a glass-based film according to a sol-gel process.

In particular, it is preferred to produce the electrodes 1, 2 having the dielectric layer 6 according to a fusion bonding method. In this method, a frit of a glass-based material, which comprises an inorganic material such as silica, magnesia, stannic oxide, titania, zirconia or alumina as the main component, is dispersed in a solvent. Next, to obtain a film of the glass-based material on an electrode material, the electrode material is dipped in the solvent including the frit, or the frit is sprayed on the electrode material by use of a spray gun. The film is heated at a temperature of 480° C. to 1000° C. for 3 to 15 minutes, so that the film of the glass-based material is fusion-bonded to the electrode material. To form the dielectric layer 6 having a desired thickness, the above procedure may be repeated. This fusion bonding method has advantages that the dielectric layer having a thin thickness can be readily formed, and it is effective to prevent the occurrence of pin-holes, which are often observed in the dielectric layer produced by the ceramic spraying method. Thus, the dielectric layer 6 formed by the fusion bonding method is suitable to insure uniform glow discharge.

It is preferred that a thickness of the dielectric layer 6 is within a range of 0.1 to 2 mm. When the thickness is less than 0.1 mm, a withstand voltage of the dielectric layer may lower. In addition, crack or peeling may occur, so that it becomes difficult to maintain the uniformity of glow discharge. When the thickness is more than 2 mm, the withstand voltage may increase excessively, so that it becomes difficult to maintain the uniformity of glow discharge.

The gas supply vessel 12 has a gas inlet 16 and a gas outlet 17. The gas supply unit 5 for supplying a gas for plasma generation is connected to the gas inlet 16 through a gas supply line 15. In FIG. 3, a depth dimension "L" of the gas supply vessel 12 is substantially same as that of the electrodes 1, 2. It is preferred that a height dimension "H" of the gas supply vessel 12 is a length suitable for providing a stable flow of the gas for plasma generation from the gas outlet 17. A width dimension "W" of the gas supply vessel 12 is substantially equal to a center-to-center distance between the electrodes 1 and 2, so that the gas supply vessel can be disposed to straddle the discharge space 22 therebetween. As shown in FIG. 3, the gas supply vessel 12 is fixed to the electrodes 1, 2 such that the gas for plasma generation can flow from the interior of the gas supply vessel 12 to the discharge space 22. The gas supply vessel 12 fixed to the electrodes is supported by the supporting member 14, as shown in FIG. 1.

The coolant supply unit 20 includes a coolant tank and a pump for pumping a coolant 9 from the coolant tank. As the coolant 9, it is possible to use pure water or ion exchange water. In addition, it is preferred that the coolant 9 is a liquid having antifreeze property at 0° C. as well as electrical insulation. As to the electrical insulation, it is preferred that the coolant 9 has a withstand voltage of at least 10 kV under 0.1 mm interval. The coolant 9 having the electrical insulation of this range is suitable to prevent a leakage from the electrode, to which a high voltage is applied. As the coolant 9 having the above-described properties, for example, it is possible to use perfluorocarbon, hydrofluoro ether or a mixture solution obtained by adding 5 to 60 wt % of ethylene glycol to pure water.

As shown in FIG. 3, opposite ends of each of the electrodes 1 and 2 are closed. A coolant supply pipe 21 is connected at its one end to the pump. The other end of the coolant supply pipe 21 is connected to an end portion of the electrode 1 to supply the coolant 9 to the interior of the electrode 1. A coolant transfer pipe 33 is connected at its one end to an opposite end portion of the electrode 1. The other end of the coolant transfer pipe 33 is connected to an end portion of the electrode 2 to send the coolant 9 from the interior of the electrode 1 to the interior of the electrode 2. A coolant drainpipe 23 is connected at its one end to an opposite end portion of the electrode 2. The other end of the coolant drainpipe 23 is connected to the coolant tank. Thus, the electrodes 1 and 2 can be cooled by circulation of the coolant 9. To maintain the insulation between the electrodes, it is preferred that the coolant transfer pipe 33 is made of an insulation material.

As a thermometer 24 for measuring a surface temperature of the electrode, it is preferred to use an infrared radiation thermometer. In FIGS. 1 and 2, the numeral 40 designates an infrared transparent window 40 formed in a top of the gas supply vessel 12. The measured electrode temperature is monitored on a display 27, and supplied to a microcomputer 30 in the controller 7 explained later. In place of the infrared radiation thermometer, a temperature sensor such as thermocouple may be used.

As the conveyer 11, for example, it is possible to use a belt conveyer, as shown in FIG. 1. The objects 4 to be treated can be successively treated with the plasma 3 by use of the belt conveyer 11. The conveyer 11 can be controlled by the controller 7 explained below. In case of applying the present invention on an industrial scale, it is particularly preferred to use the conveyer to further improve a treatment efficiency of the plasma treatment apparatus.

The controller 7 is mainly composed of the microcomputer (personal computer) 30 for monitoring the surface temperature of the electrode according to an output from the thermometer 24, and controlling a magnitude of the AC voltage applied to the electrode 2 and a conveying speed of the objects 4. The pump for pumping the coolant 9 can be controlled by the controller 7. For example, when the measured electrode temperature is higher than a predetermined threshold temperature, the microcomputer 30 sends a control signal for increasing a flow amount of the coolant 9 to the pump. Alternatively, a cooling device for coolant may be adopted to reduce the coolant temperature according to an output from the controller 7.

Next, a plasma treatment method performed by use of the above-explained apparatus is explained.

First, the gas for plasma generation is supplied from the gas supply unit 5 to the gas supply vessel 12. As the gas for plasma generation used in the present invention, it is possible to use an inert gas (rare gas), mixture of inert gases or a mixture of an inert gas and a reactive gas. As the inert gas, it is possible to use helium, argon, neon, or xenon. In views of discharge stability and cost efficiency, it is preferred to use helium, argon or a mixture of helium and argon. A mixture ratio of helium and argon is closely related to the surface temperature of the electrode. For example, when the surface temperature of the electrode is 250° C. or less, it is preferred that an amount of argon in the mixture gas is 90 wt % or less. When the argon amount is more than 90 wt %, a probability of the occurrence of the streamer discharge may increase.

The reaction gas can be optionally selected according to a purpose of the plasma treatment. For example, when cleaning organic substances on the objects 4, removing resists, or etching organic films, it is preferred to use an oxidative gas such as oxygen, air, $CO_2$, steam or $N_2O$. In addition, when etching silicon, it is effective to use a fluorine-based gas such as $CF_4$ as the reaction gas. When reducing metal oxides, it is possible to use a reducing gas such as hydrogen or ammonia. As an example, it is preferred that an additive amount of the reaction gas is within a range of 10 wt % or less, and more preferably 0.1 to 5 wt % relative to the amount of inert gas. When oxidation or fluorination of the object surface by the reaction gas comes into problem, only inert gas may be used for the plasma treatment without using the reaction gas.

The gas for plasma generation is provided to the discharge space 22 between the electrodes 1 and 2 through the gas outlet 17. The plasma 3 is generated by applying an AC voltage between the electrodes. In the present invention, it is preferred that a frequency of the AC power supply is within a range of 50 Hz to 200 MHz, and particularly 1 kHz to 200 MHz. When the frequency is less than 50 Hz, there is a possibility that the discharge can not be stabilized in the discharge space 22. When the frequency is more than 200 MHz, a considerable temperature rise of the plasma 3 may occur.

In addition, it is preferred that an electric power per unit volume of plasma is within a range of 10 to 10000 $W/cm^3$, and a flow rate of the plasma 3 is within a range of 20 to 10000 cm/second. When the above conditions are not satisfied, the plasma treatment may not be sufficiently performed to the objects 4, or the objects may receive thermal damage. Therefore, it is preferred to regulate a magnitude of the AC voltage and supply amount and rate of the gas for plasma generation so as to satisfy the above ranges.

It is preferred that the surface temperature of the electrode is maintained at 250° C. or less, and particularly 200° C. or less during the plasma treatment. When the electrode temperature is more than 250° C., streamer discharge may be generated in the discharge space 22. There is no limitation as to a lower-limit value of the electrode temperature. For example, the lower-limit temperature may be 0° C. or less. In other words, a temperature at which the coolant does not freeze is available. In addition, when the electrodes 1 and 2 can be sufficiently cooled by means of air cooling, it is not necessary to use the coolant 9.

By the way, it is believed that one of the reasons why streamer discharge (arc discharge) is generated is because the surface temperature of the electrode is increased by the plasma. In the present plasma treatment, the plasma 3 is generated under substantially atmospheric pressure of the gas for plasma generation. In the plasma 3, gas particles are colliding incessantly. In comparison with a reduced-pressure plasma, mean free path is shorter in the atmospheric pressure plasma. This means that a collision frequency of the gas particles is higher in the atmospheric pressure plasma. As the collision frequency is higher, the plasma temperature raises. In addition, the collision frequency is closely related to a frequency of the AC power supply. As the frequency of the AC power supply is higher, amounts of radicals and ions suitable for the plasma treatment increase. However, the plasma temperature raises, and the surface temperature of the electrode is also increased. In particular a temperature increase of opposed surfaces of the electrodes 1, 2, which are exposed to the plasma 3, is significant. This temperature increase locally causes a large amount of electron emission from the electrode surface. It is believe that streamer discharge is induced by the electron emission. Once the streamer discharge occurs, the plasma treatment can not be continued because the plasma (glow discharge) becomes unstable. When the streamer discharge occurs between the electrode and the object, the object may suffer considerable damage. In addition, there is problem that a part of the electrode material is evaporated by the streamer discharge, and the evaporated electrode material is deposited on the object.

In the plasma treatment apparatus shown in FIG. 1 of the present invention, to prevent the occurrence of streamer discharge, the cylindrical electrodes, 1, 2, each of which has the curved surface R jutting into the discharge space 22, are used, and also the coolant supply unit 20 for supplying the coolant 9 into the interior of the electrodes 1 and 2 is used to reduce the surface temperature of the electrode and prevent such a local electron emission from the electrode surface. Therefore, it is possible to stably maintain uniform glow discharge during the plasma treatment.

Figure 4A:
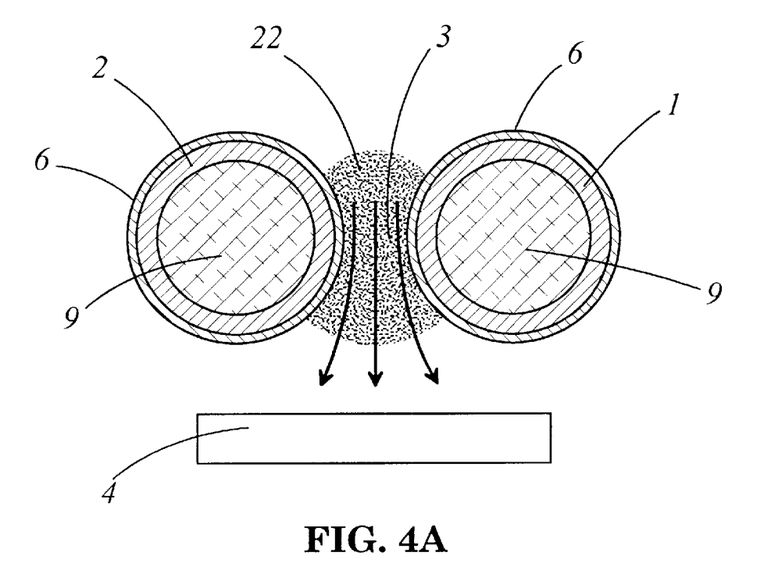
FIG. 4A is an illustration of plasma generated between cylindrical electrodes.
Figure 4B:
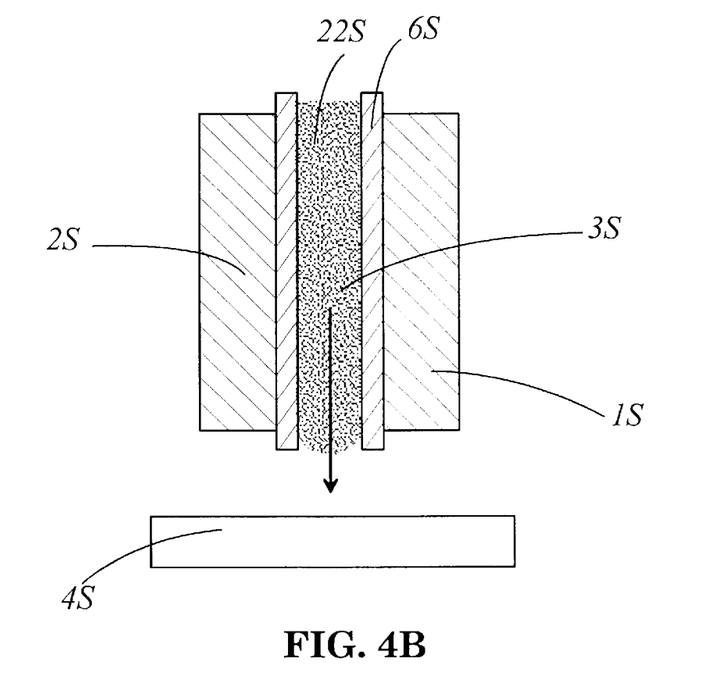
FIG. 4B is an illustration of plasma generated between flat-panel electrodes.

In addition, since the cylindrical electrodes 1 and 2 are used in the plasma treatment apparatus of FIG. 1, it is possible to increase a plasma density per unit volume of glow discharge by narrowing the distance between the electrodes, and also generate a plasma jet (plasma flow) 3, which spreads out downward from the discharge space 22 along the outer peripheral surfaces of the electrodes, as shown by the arrows in FIG. 4A. By treating the object 4 with the plasma jet 3 with the increased plasma density, it is possible to improve the treatment efficiency. On the contrary, as shown in FIG. 4B, when a pair of flat-panel electrodes 1S and 2S are used, a plasma jet (plasma flow) 3S having a narrow width is merely provided from a discharge space 22S between the electrodes. In addition, it is difficult to relatively increase an electric power per unit volume of plasma, as described before. Therefore, an area of the object 4S treated by the plasma jet 3S will be limited. In FIG. 4B, the numeral 6S designates a dielectric plate.

Figure 5:
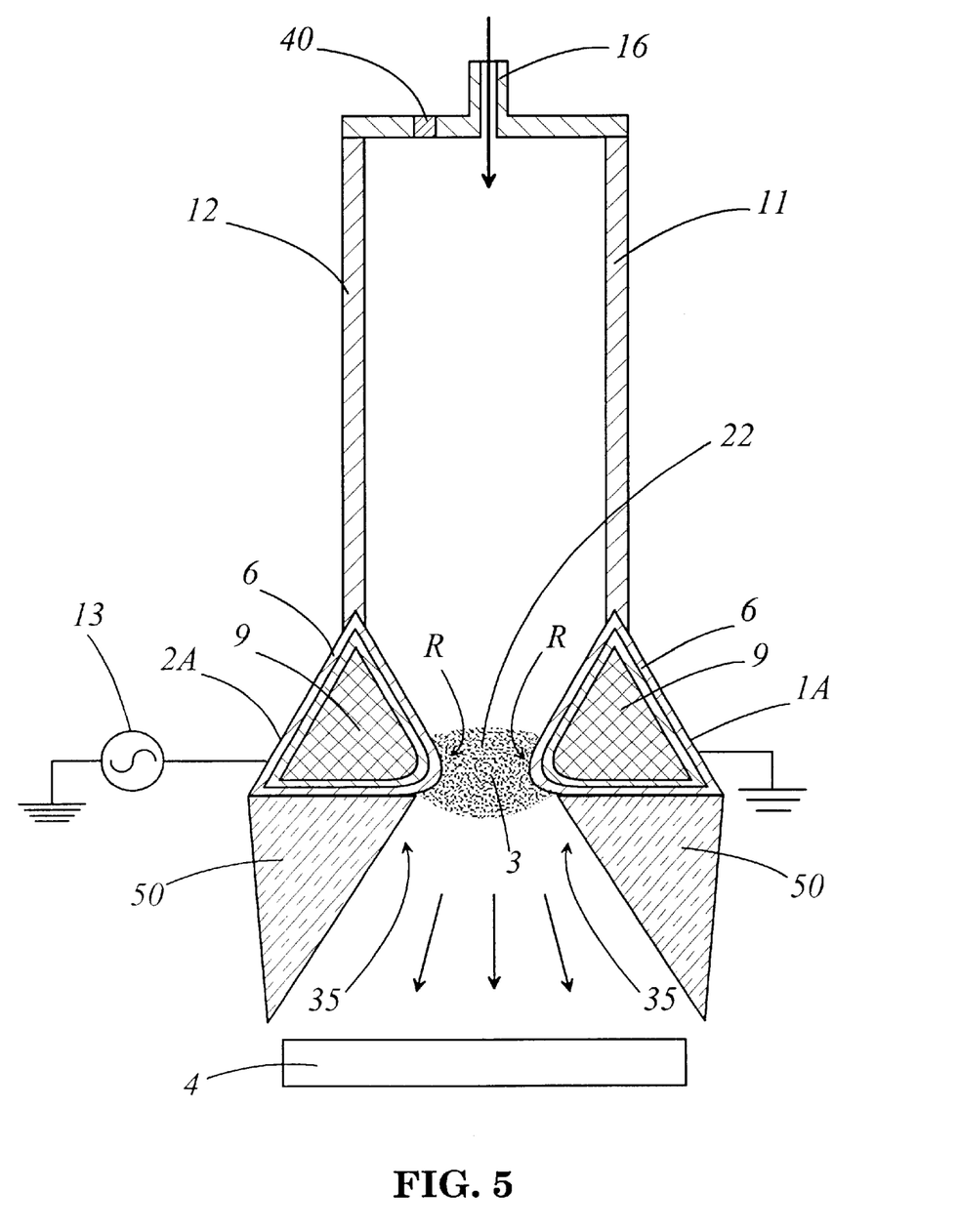
FIG. 5 is a schematic cross-sectional view showing another plasma generator for the plasma treatment apparatus of the present invention.

As a first modification of the electrode structure, it is possible to use a pair of tubular electrodes 1A, 2A each having a substantially triangular cross section, as shown in FIG. 5. The electrodes are arranged such that a downside of the electrode 1A is flush with the downside of the electrode 2A, and the electrodes extend in parallel. A discharge space 22 is defined between opposite vertex portions of the electrodes. A curved surface R jutting into the discharge space 22 is formed at each of the vertex portions of the electrodes 1A and 2A. It is preferred that a radius of curvature of the curved surface R is within a range of 1 to 25 mm. An inner space of each of the electrodes 1A and 2A is used to circulate a coolant 9. Each of the electrodes has a dielectric layer 6 of alumina as the outer layer. In addition, a pair of plasma guide members 50 each having a triangular cross section are disposed adjacent to the electrodes 1A and 2A to define a plasma diffusible zone 35. The plasma diffusible zone 35 allows the plasma 3 to spread out toward the object 4 placed at a downstream side from the discharge space 22. In the plasma treatment apparatus of FIG. 1 using the cylindrical electrodes 1, 2, the plasma 3 is guided to spread out toward the object 4 from the discharge space 22 by the structure of the cylindrical electrode itself. In other words, each of the cylindrical electrodes has a plasma guide portion acting as the plasma guide member. The plasma 3 generated in the discharge space 22 spreads out along the plasma guide portion, i.e., a part of the outer peripheral surface of each of the cylindrical electrodes, and then reaches the object 4. In FIG. 2, the numeral 35 designates a plasma diffusible zone obtained under the electrodes 1, 2.

Figure 6:
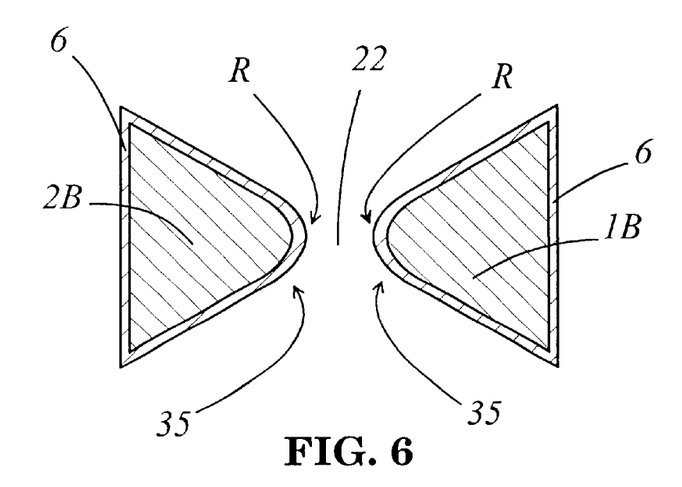
FIG. 6 is a schematic cross-sectional view showing a modification of a pair of electrodes for the plasma treatment apparatus of the present invention.

As a second modification of the electrode structure, as shown in FIG. 6, it is possible to use electrodes 1B, 2B each having a substantially triangular cross section. When the electrodes 1B, 2B are arranged, as shown in FIG. 6, plasma diffusible zone 35 is obtained under the electrodes without using plasma guide members separately.

Figure 7:
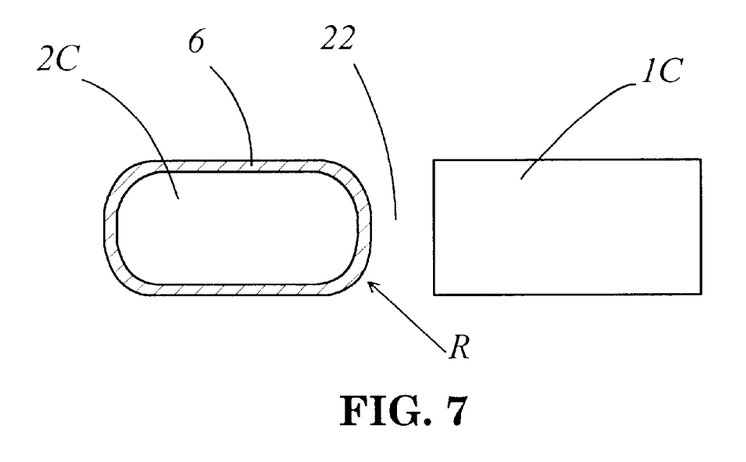
FIG. 7 is a schematic cross-sectional view showing a further modification of a pair of electrodes for the plasma treatment apparatus of the present invention.

As a third modification of the electrode structure, as shown in FIG. 7, it is possible to use a pair of a first electrode 1C having a rectangular cross section and a second electrode 2C having an ellipse cross section. In this case, a discharge space 22 is defined between a flat surface of the first electrode 1C and a curved surface R of the second electrode 2C. In addition, it is preferred that at least one of a pair of electrodes is formed to have a substantially hemispherical surface projecting on a flat surface thereof, and is arranged such that the hemispherical surface juts into a discharge space between the electrodes.

Figure 8:
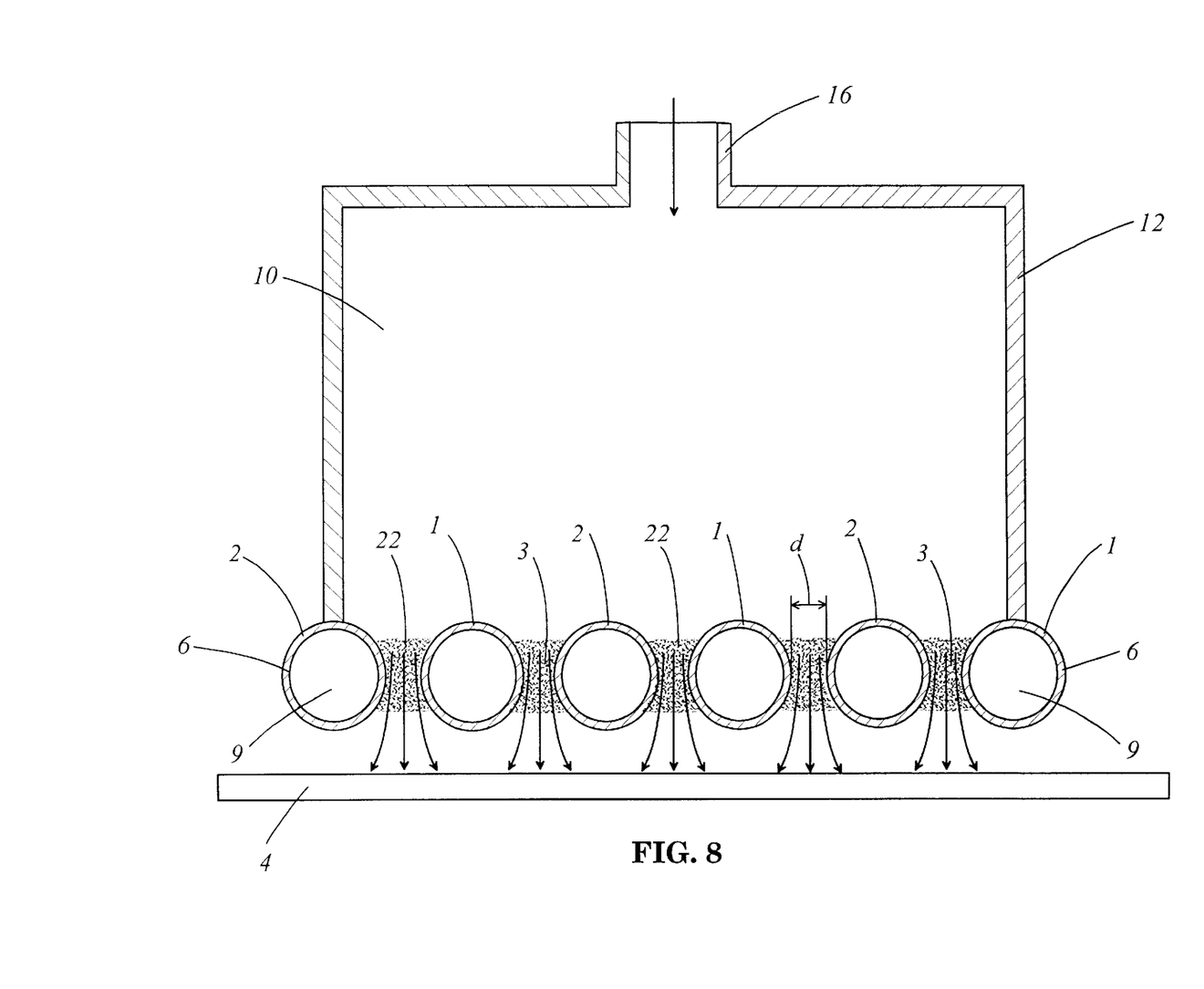
FIG. 8 is a schematic cross-sectional view showing another embodiment of a plasma generator of the present invention.

Additionally, it is preferred to use a plasma generator 10 shown in FIG. 8. This plasma generator 10 includes a plurality of pairs of electrodes 1, 2 each having a cylindrical structure and a gas supply vessel 12 having a gas inlet 16. The electrodes 1, 2 are alternately arranged such that each of the electrodes 1 extends substantially parallel to adjacent electrode 2. Each of the electrodes 1 is spaced from adjacent electrode 2 by a distance d. A discharge space 22 is defined between adjacent electrodes 1 and 2. All of the electrodes 2 are connected to an AC power supply, and all of the electrodes 1 are grounded. Each of the electrodes 1, 2 has a dielectric layer 6 at an outer surface thereof. An outer peripheral curved surface of the respective electrode juts into the discharge space 22. A gas for plasma generation is supplied into the gas supply vessel 12 through the gas inlet 16. An AC voltage is applied between the electrodes 1 and 2 to generate plasmas 3.

Figure 9:
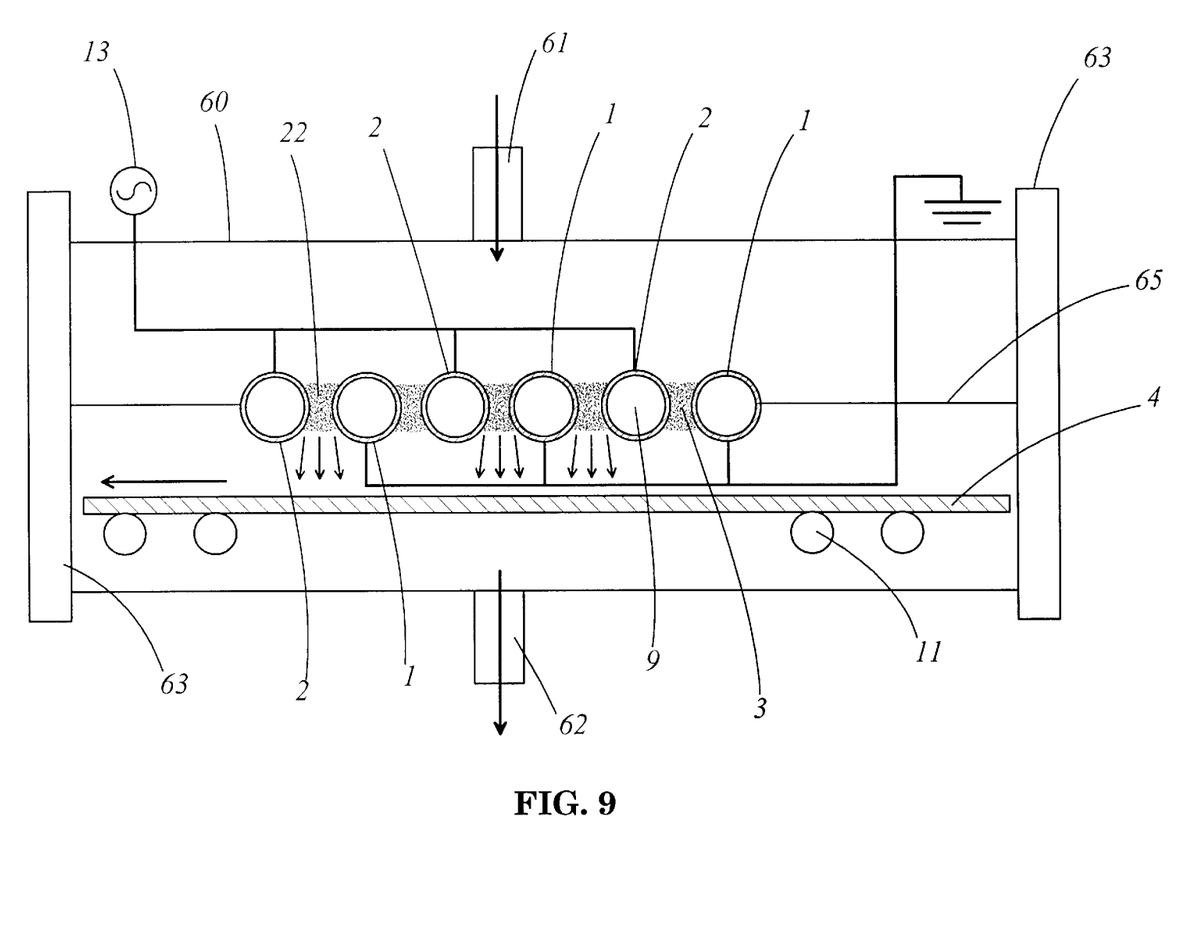
FIG. 9 is a schematic cross-sectional view showing another embodiment of a plasma treatment apparatus of the present invention.

FIG. 9 is a schematic cross-sectional view showing a plasma treatment apparatus capable of treating an object 4 with plasmas 3. Cylindrical electrodes 1, 2 are disposed according to the same manner as the plasma generator of FIG. 8 in a treatment chamber 60 having inline-type gates 63 at opposite sides. In place of the inline-type gate, it is possible to use a shuttle-type gate. All of the electrodes 2 are connected to an AC power supply 13, and all of the electrodes 1 are grounded. In FIG. 9, the numeral 61 designates a gas inlet for supplying a gas for plasma generation into the treatment chamber 60. The numeral 62 designates a gas outlet. The numeral 11 designates a conveyer with rollers for conveying the object 4 to be treated. A coolant 9 is supplied to the interior of the electrodes 1, 2 to reduce an electrode temperature during a plasma treatment. The gas for plasma generation is supplied into the treatment chamber 60 through the gas inlet 61. The numeral 65 designates a partition board. This partition board 65 is useful to selectively supply the gas for plasma generation into discharge spaces 22. An AC voltage is applied between the electrodes 1 and 2 to generate the plasmas 3 in the discharge spaces 22. By use of this apparatus, since the object 4 is treated with the plasmas 3, it is more effective to treat a larger area (wider range) of the object at a time. The other components are substantially same as those of the plasma treatment apparatus of FIG. 1.

Figure 10:
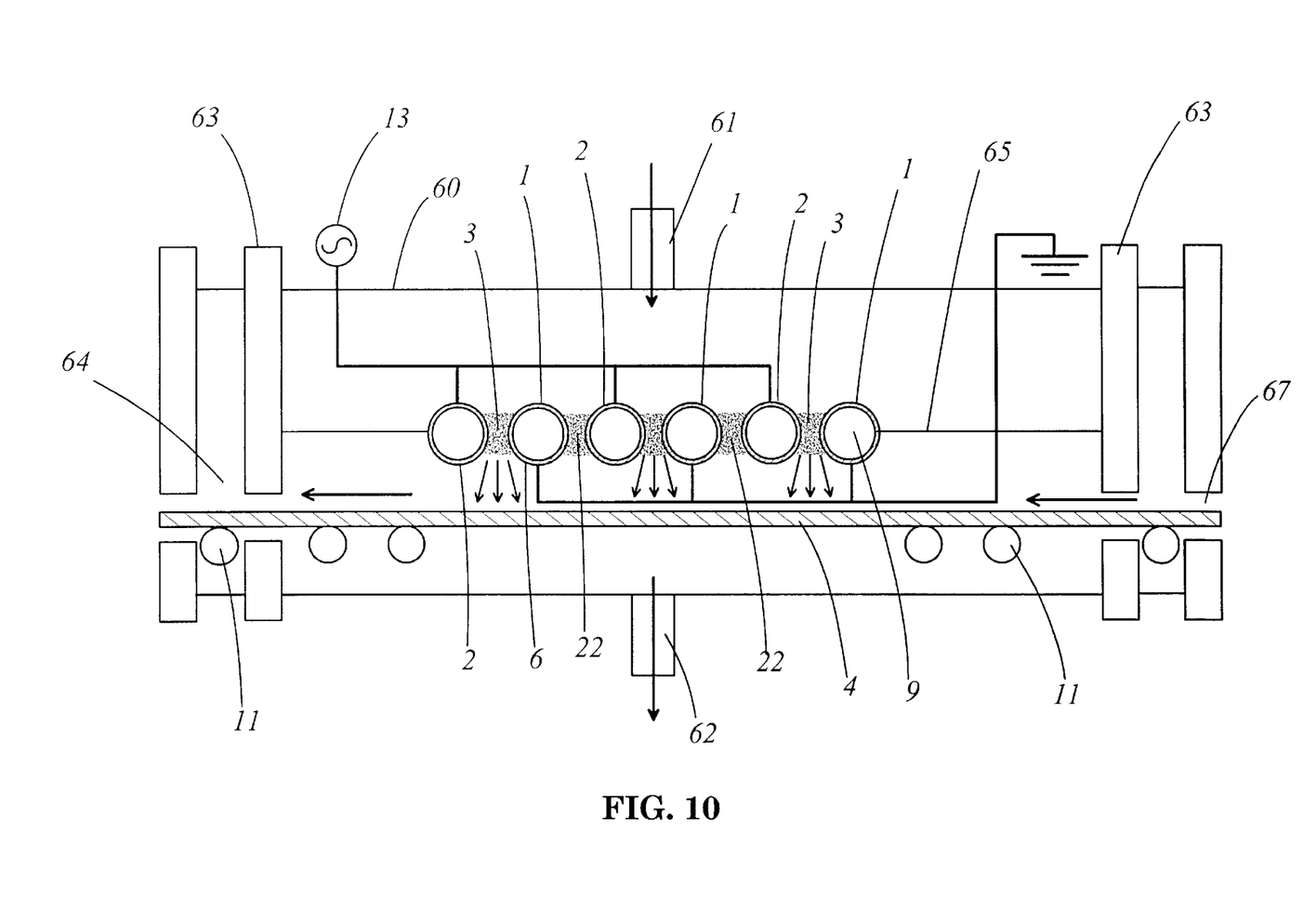
FIG. 10 is a schematic cross-sectional view showing a modification of the plasma treatment apparatus of FIG. 9.

FIG. 10 shows a modification of the plasma treatment apparatus of FIG. 9. In this apparatus, a treatment chamber 60 having inline-type gates 63 at opposite sides. This inline-type gate 63 is characterized by slits 67, through which an object 4 to be treated can be supplied into the treatment chamber 60 or removed from the treatment chamber. In FIG. 9, the numeral 64 designates a relaxation room, which is useful to reduce a leakage of the gas for plasma generation from the treatment chamber 60 to the outside, and minimize a volume of the outside air flowing into the treatment chamber. The other components are substantially same as those of the plasma treatment apparatus of FIG. 9.

EXAMPLE 1

A plasma treatment was performed by use of the plasma treatment apparatus of FIG. 1. Stainless steel pipes each having an alumina layer of a thickness of 200 $\mu$m as a dielectric layer 6 were used as electrodes 1, 2. An average surface roughness of a peripheral surface of the respective electrode is 10 $\mu$m. The dielectric layer 6 was formed by a ceramic spraying method. A distance between the electrodes 1 and 2 is 1 mm. A radius of curvature of the curved surface R of each of the electrodes 1, 2 is 5 mm. An object 4 to be treated was prepared by forming a 1 $\mu$m-thickness film of a negative-type resist (manufactured by Tokyo Ohka Kogyo Co., Ltd. "OMR-83") on a silicon wafer. As a gas for plasma generation, a mixture gas of helium, argon and oxygen was used. A flow amount of helium is 2 liter/minute. A flow amount of argon is 7 liter/minute. A flow amount of oxygen is 50 cc/minute.

The electrode 1 was grounded, and the electrode 2 was connected to an AC power supply 13 of a frequency of 13.56 MHz. An AC voltage (applied electric power: 1000 W) was applied between the electrodes to generate plasma 3 under atmospheric pressure. An etching treatment was performed to the object 4 by use of this plasma 3. A surface temperature of the electrode was measured by an infrared radiation thermometer 24 (manufactured by Chino Corp.) during the plasma etching treatment. The measured electrode temperature is 250° C. An electric power per unit volume of the plasma 3 is 400 W/cm$^3$. Time required to completely peel off the resist from the object 4 by the plasma etching treatment was measured. From the measurement results, a resist-etching rate is 1.5 $\mu$m/minute. After the treatment, no thermal damage or damage caused by streamer discharge was observed on the object 4. The above-described experimental conditions and evaluation results are shown in Table 1.

EXAMPLE 2

A plasma treatment was performed by use of the plasma treatment apparatus of FIG. 1 according to a substantially same manner as Example 1 except for using experimental conditions shown in Table 1. In this Example, ion-exchange water was circulated as a coolant 9 in electrodes 1, 2 during the plasma treatment. After the plasma treatment, no thermal damage or damage caused by streamer discharge was observed on an object 4. Results are shown in Table 1.

EXAMPLE 3

A plasma treatment was performed by use of the plasma treatment apparatus of FIG. 1 according to a substantially same manner as Example 1 except for using experimental conditions shown in Table 1. In this Example, a mixture of alumina and MgO (MgO content is 5 vol %) was used as a dielectric layer 6. The dielectric layer 6 was formed to have a thickness of 700 μm by a ceramic spraying method. In addition, HFE-7100 (manufactured by Sumitomo 3M Co., Ltd.) was circulated as a coolant 9 in electrodes 1, 2 during the plasma treatment. After the plasma treatment, no thermal damage or damage caused by streamer discharge was observed on an object 4. Results are shown in Table 1.

EXAMPLE 4

A plasma treatment was performed by use of the plasma treatment apparatus of FIG. 1 according to a substantially same manner as Example 1 except for using experimental conditions shown in Table 1. In this Example, a glaze including silica, magnesia, titania, zirconia and alumina was used as a dielectric layer 6. The dielectric layer 6 was formed to have a thickness of 1000 μm by a fusion bonding method. After the plasma treatment, no thermal damage or damage caused by streamer discharge was observed on an object 4. Results are shown in Table 1.

EXAMPLE 5

A plasma treatment was performed by use of the plasma treatment apparatus of FIG. 1. Stainless steel pipes each having a titania layer of a thickness of 200 μm as a dielectric layer 6 were used as electrodes 1, 2. An average surface roughness of a peripheral surface of the respective electrode is 20 μm. The dielectric layer 6 was formed by a ceramic spraying method. A distance between the electrodes 1 and 2 is 1 mm. A radius of curvature of the curved surface R of each of the electrodes 1, 2 is 10 mm. Fluorinert™ FC-77 (manufactured by Sumitomo 3M Co., Ltd.) was circulated as a coolant 9 in the electrodes 1, 2 during the plasma treatment. As a gas for plasma generation, a mixture gas of helium, argon and oxygen was used. A flow amount of helium is 3 liter/minute. A flow amount of argon is 9 liter/minute. A flow amount of oxygen is 100 cc/minute. In this Example, plastic BGA (Ball Grid Array) substrates (50×200 mm) were used as objects 4. This substrate was prepared by forming a 40 μm-thickness film of a resist ink (manufactured by Taiyo Ink MFG. Co., Ltd. "PSR-4000AUS5") on a BT (bismaleimide triazine) resin plate having a thickness of 0.5 mm. This BGA substrate has a gold-plated portion and carries an IC chip thereon. The objects 4 were conveyed at a conveying speed of 2 cm/second by use of a conveyer 11.

The electrode 1 was grounded, and the electrode 2 was connected to an AC power supply 13 of a frequency of 13.56 MHz. An AC voltage (applied electric power: 1000 W) was applied between the electrodes to generate plasma 3 under atmospheric pressure. A surface temperature of the electrode was measured by an infrared radiation thermometer 24 during the plasma treatment. The measured electrode temperature is 200° C. An electric power per unit volume of the plasma 3 is 200 W/cm³.

The following evaluations were performed in this Example. That is, a contact angle of water on the resist was measured before the plasma treatment. The contact angle is 80 degrees. After the plasma treatment, the contact angle was measured again. The contact angle became 8 degrees. Next, a wire bonding was formed between the gold plated portion and the IC chip of the non-treated BGA substrate having the contact angle of 80 degrees, and a bonding strength therebetween was measured. The bonding strength is 5 g. Similarly, a wire bonding was formed between the gold plated portion and the IC chip of the plasma-treated BGA substrate having the contact angle of 8 degrees, and the bonding strength therebetween was measured. The bonding strength is 8 g. Thus, the bonding strength was improved by the plasma treatment.

Moreover, a seal resin (manufactured by Matsushita Electric Works, Ltd. "Panasealer CV8100Z") was molded at 175° C. to be a dome-like shape (a diameter of the underside is 11.3 mm.) on each of the non-treated and plasma-treated BGA substrates, and then a peel strength by shearing stress was measured. The peel strength of the seal resin on the non-treated BGA substrate is 11 MPa. On the contrary the peel strength of the seal resin on the plasma-treated BGA substrate is 20 MPa. Thus, the peel strength was improved by the plasma treatment. Results are shown in Table 2.

EXAMPLE 6

A plasma treatment was performed by use of the plasma treatment apparatus of FIG. 1 according to a substantially same manner as Example 6 except for using experimental conditions shown in Table 2. In this Example, copper-based lead frame substrates (50×200 mm) each having a gold-plated portion and carrying an IC chip thereon were used as objects 4. Results are shown in Table 2. The results of evaluation tests show that the bonding strength and peel strength be improved by the plasma treatment.

EXAMPLE 7

A plasma treatment was performed by use of the plasma treatment apparatus of FIG. 1. Stainless steel pipes each having a titania layer of a thickness of 500 μm as a dielectric layer 6 were used as electrodes 1, 2. An average surface roughness of a peripheral surface of the electrode is 50 μm. The dielectric layer 6 was formed by a ceramic spraying method. A distance between the electrodes 1 and 2 is 0.5 mm. A radius of curvature of the curved surface R of each of the electrodes 1, 2 is 10 mm. Fluorinert™ FC-77 (manufactured by Sumitomo 3M Co., Ltd.) was circulated as a coolant 9 in the electrodes 1, 2 during the plasma treatment. As a gas for plasma generation, a mixture gas of helium and argon, oxygen and $CF_4$ was used. A flow amount of helium is 1 liter/minute. A flow amount of argon is 3 liter/minute. A flow amount of oxygen is 100 cc/minute. A flow amount of $CF_4$ is 50 cc/minute.

The electrode 1 was grounded, and the electrode 2 was connected to an AC power supply 13 of a frequency of 13.56 MHz. An AC voltage (applied electric power: 1000 W) was applied between the electrodes to generate plasma 3 under atmospheric pressure. A surface temperature of the electrode was measured by an infrared radiation thermometer 24 during the plasma treatment. The measured electrode temperature is 200° C. An electric power per unit volume of the plasma 3 is 100 W/cm³.

In this Example, a surface of a Sn-Ag solder bump formed on a semiconductor chip and a metallized portion of a Ni/Au metallized substrate were used as objects 4 to be treated. After an alignment of the semiconductor chip and the Ni/Au metallized substrate was performed in the air, they were reflowed at 230° C. in a belt-type furnace in nitrogen atmosphere (oxygen concentration: 80 ppm). When the plasma treatment was not performed to the semiconductor chip and the Ni/Au metallized substrate, the semiconductor chip could not be bonded with the Ni/Au metallized substrate by the reflow step. However, when the plasma treatment was performed to the semiconductor chip and the Ni/Au metallized substrate, a good bonding state between the semiconductor chip and the Ni/Au metallized substrate was obtained by the reflow step. The experimental conditions and evaluation results are shown in Table 3.

EXAMPLE 8

A plasma treatment was performed by use of a plasma treatment apparatus, which is substantially same as the apparatus of FIG. 1 except for using a plasma generator shown in FIG. 5. Each of electrodes 1A, 2A was obtained by forming an alumina layer as a dielectric layer 6 on a stainless steel pipe having a substantially triangular cross section. A wall thickness of the stainless steel pipe is 1 mm. A dimension of each side of the triangular cross section is 10 mm. Each of the electrodes 1A, 2A has a curved surface R at a vertex portion thereof. A radius of curvature of the curved surface R is 3 mm. A discharge space 22 is defined between the curved surfaces R of the electrodes 1A, 2A. A distance between the electrodes is 1 mm. The dielectric layer 6 was formed to have a thickness of about 500 $\mu$m by a ceramic spraying method. An average surface roughness of a peripheral surface of the respective electrode is 50 $\mu$m. A pair of plasma guide members 50 made of Teflon® were disposed adjacent to the electrodes. A length of the hypotenuse of the plasma guide member 50 is 15 mm. Ion-exchange water was circulated as a coolant 9 in the electrodes 1A, 2A during the plasma treatment. An object 4 to be treated was prepared by forming a 1 $\mu$m-thickness film of a negative-type resist (manufactured by Tokyo Ohka Kogyo Co., Ltd. "OMR-83") on a silicon wafer. As a gas for plasma generation, a mixture gas of helium and oxygen was used. A flow amount of helium is 10 liter/minute. A flow amount of oxygen is 100 cc/minute.

The electrode 1 was grounded, and the electrode 2 was connected to an AC power supply 13 of a frequency of 100 kHz. An AC voltage (applied electric power: 1500 W) was applied between the electrodes to generate plasma 3 under atmospheric pressure. An etching treatment was performed to an object 4 by use of this plasma 3. After the etching treatment, no thermal damage or damage caused by streamer discharge was observed on the object 4. The experimental conditions and evaluation results are shown in Table 3.

EXAMPLE 9

A plasma treatment was performed by use of the plasma treatment apparatus shown in FIG. 9. Each of electrodes 1, 2 is a cylindrical stainless steel pipe (JIS: SUS316) of an outer diameter 6.35 mm having a dielectric layer 6 on its outer surface. The dielectric layer 6 was formed by a fusion bonding method. That is, a frit containing silica, magnesia and alumina were added in a solvent, and 150 g of the resultant mixture was sprayed on the stainless steel pipe by use of a spray gun to obtain a film. The film was heated at 850° C. for 10 minutes to be fusion-bonded to the stainless steel pipe. A thickness of the obtained dielectric layer 6 is 500 $\mu$m. A distance between adjacent electrodes 1 and 2 is 1 mm. A treatment chamber 60 (520 mm (L)×352 mm (W)×200 mm (H)) is made of an acrylic resin. Each of the electrodes 1 and 2 were supported by a holder (not shown) formed on a side wall of the treatment chamber. A conveyer 11 was disposed under the electrodes in the treatment chamber 60. The conveyer 11 is composed of a plurality of round bars made of Teflon®, motor disposed at the outside of the treatment chamber, pulley, and a rubber belt. As a gate structure of the treatment chamber 60, an inline gate 63 having an open/close mechanism of air-pressure type was used. The inside of the treatment chamber is airtightly sealed from the outside by use of packing members such as O-rings.

As objects 4 to be treated, glass plates (0.7 mm×200 mm×300 mm) for liquid crystal were used. All of the electrodes 1 were grounded, and all of the electrodes 2 were connected to an AC power supply 13 of a frequency of 100 kHz. An AC voltage (applied electric power: 1000 W) was applied between the electrodes 1 and 2 to generate plasmas 3 under atmospheric pressure. Pure water was circulated as a coolant 9 in the electrodes 1, 2 during the plasma treatment. As a gas for plasma generation, a mixture gas of helium and oxygen was used. A flow amount of helium is 10 liter/minute. A flow amount of oxygen is 100 cc/minute. A vertical distance between the object 4 and the electrode 1, 2 is 5 mm. The objects 4 were conveyed at a conveying speed of 15 mm/second by use of the conveyer 11. By use of the plasmas 3, the plasma treatment (surface modification and cleaning) was performed to the objects 4.

The following evaluation was performed in this Example. That is, a contact angle of water on the glass plate was measured before the plasma treatment. The contact angle is 45 degrees. After the plasma treatment, the contact angle was measured again. The contact angle became 6 degrees. Thus, the contact angle of water on the glass plate was reduced by the plasma treatment of the present invention. The decrease in contact angle of water will provide an improved wire-bonding strength. The experimental conditions and evaluation results are shown in Table 3.

TABLE 1

| | EXAMPLES | | | |
|---|---|---|---|---|
| | 1 | 2 | 3 | 4 |
| Electrode | | | | |
| Electrode material | Stainless steel pipe | Copper pipe | Stainless steel pipe | Aluminum pipe |
| Material of dielectric layer | Al$_2$O$_3$ | Al$_2$O$_3$ | Mixture of Al$_2$O$_3$ and MgO | Glaze |
| Average surface roughness Ra ($\mu$m) | 10 | 20 | 100 | 100 |
| Thickness of dielectric layer ($\mu$m) | 200 | 500 | 700 | 1000 |
| Distance between electrodes (mm) | 1 | 1 | 0.5 | 1 |
| Radius of curvature of curved surface R (mm) | 5 | 10 | 20 | 10 |
| Coolant | Not used | Ion exchange water | HFE7100 | Not used |
| Gas for plasma generation | | | | |
| Flow amount of He (liter/minute) | 2 | 5 | 1 | 0.5 |
| Flow amount of Ar (liter/minute) | 7 | 13 | 1 | 3 |
| Flow amount of O$_2$ (cc/minute) | 50 | 100 | 50 | 10 |

TABLE 1-continued

| | EXAMPLES | | | |
|---|---|---|---|---|
| | 1 | 2 | 3 | 4 |
| Plasma generating condition | | | | |
| Frequency of AC power supply (MHz) | 13.56 | 60 | 60 | 60 |
| Applied electric power (W) | 1000 | 500 | 400 | 400 |
| Electrode temperature (° C.) | 250 | 150 | 50 | 100 |
| Electric power per unit volume of plasma (W/cm$^3$) | 400 | 50 | 15 | 40 |
| Evaluation results | | | | |
| Resist etching rate ($\mu$m/minute) | 1.5 | 2.5 | 3.5 | 3.0 |
| Damage by streamer discharge | None | None | None | None |

TABLE 2

| | EXAMPLES | |
|---|---|---|
| | 5 | 6 |
| Electrode | | |
| Electrode material | Stainless Steel pipe | Copper pipe |
| Material of dielectric layer | TiO$_2$ | TiO$_2$ |
| Average surface roughness Ra ($\mu$m) | 20 | 50 |
| Thickness of dielectric layer ($\mu$m) | 200 | 500 |
| Distance between electrodes (mm) | 1 | 1 |
| Radius of curvature of curved surface R (mm) | 10 | 10 |
| Coolant | Fluorinert ™ FC-77 | Fluorinert ™ FC-77 |
| Gas for plasma generation | | |
| Flow amount of He (liter/minute) | 3 | 1 |
| Flow amount of Ar (liter/minute) | 9 | 3 |
| Flow amount of O$_2$ (cc/minute) | 100 | 50 |
| Plasma generating condition | | |
| Frequency of AC power supply (MHz) | 13.56 | 13.56 |
| Applied electric power (W) | 1000 | 300 |
| Electrode temperature (° C.) | 200 | 200 |
| Electric power per unit volume of plasma (W/cm$^3$) | 200 | 100 |
| Evaluation results | | |
| Plasma treatment | | |
| Contact angle of water (°) | | |
| NO | 80 | 70 |
| YES | 8 | 8 |
| Bonding strength of wire bonding (g) | | |
| NO | 5 | 4 |
| YES | 8 | 8 |
| Peel strength of seal resin (MPa) | | |
| NO | 11 | 11 |
| YES | 20 | 20 |

TABLE 3

| | EXAMPLES | | |
|---|---|---|---|
| | 7 | 8 | 9 |
| Electrode | | | |
| Electrode material | Stainless Steel pipe | Stainless Steel pipe | Stainless Steel pipe |
| Material of dielectric layer | TiO$_2$ | Al$_2$O$_3$ | Glaze |
| Average surface roughness Ra ($\mu$m) | 50 | 50 | 50 |
| Thickness of dielectric layer ($\mu$m) | 500 | 500 | 500 |
| Distance between electrodes (mm) | 0.5 | 1 | 1 |
| Radius of curvature of curved surface R (mm) | 10 | 3 | 3.175 |
| Coolant | Not used | Ion exchange water | Pure water |
| Gas for plasma generation | | | |
| Flow amount of He (liter/minute) | 1 | 10 | 10 |
| Flow amount of Ar (liter/minute) | 3 | Not used | Not used |
| Flow amount of O$_2$ (cc/minute) | 100 | 100 | 100 |
| Flow amount of CF$_4$ (cc/minute) | 50 | Not used | Not used |
| Plasma generating condition | | | |
| Frequency of AC power supply | 13.56 MHz | 100 kHz | 100 kHz |
| Applied electric power (W) | 1000 | 1500 | 1000 |
| Electrode temperature (° C.) | 200 | 200 | 80 |
| Electric power per unit volume of plasma (W/cm$^3$) | 100 | 1100 | 115 |
| Evaluation results | | | |
| Plasma treatment | | | |
| Bonding state between semiconductor chip and Ni/Au metallized substrate | | | |
| NO | Bad | — | — |
| YES | Good | — | — |
| Contact angle of water on glass plate for liquid crystal (°) | | | |
| NO | — | — | 45 |
| YES | — | — | 6 |
| Damage by streamer discharge | None | None | None |

LIST OF REFERENCE NUMERALS

| | |
|---|---|
| 1 | cylindrical electrode |
| 2 | cylindrical electrode |
| 3 | plasma |
| 4 | object |
| 5 | gas supply unit |
| 6 | dielectric layer |
| 7 | controller |
| 9 | coolant |
| 10 | plasma generator |
| 11 | conveyer |
| 12 | gas supply vessel |
| 13 | AC power source |
| 14 | support member |
| 15 | gas supply line |
| 16 | gas inlet |
| 17 | gas inlet |
| 20 | coolant supply unit |
| 21 | coolant supply pipe |
| 22 | discharge space |
| 23 | coolant drainpipe |

-continued

LIST OF REFERENCE NUMERALS

| | |
|---|---|
| 24 | thermometer |
| 27 | display |
| 30 | microcomputer |
| 33 | coolant transfer pipe |
| 35 | plasma diffusible zone |
| 40 | infrared transparent window |
| 50 | plasma guide member |
| 60 | treatment chamber |
| 61 | gas inlet |
| 62 | gas outlet |
| 63 | inline-type gate |
| 64 | relaxation room |
| 65 | partition board |
| 67 | slit |
| 1A | tubular electrode |
| 2A | tubular electrode |
| 1B | electrode |
| 2B | electrode |
| 1C | first electrode |
| 2C | second electrode |
| 1S | flat-panel electrode |
| 2S | flat-panel electrode |
| 3S | plasma |
| 4S | object |
| 6S | dielectric layer |
| 22S | discharge space |

What is claimed is:

1. A plasma treatment apparatus for treating an object placed at a downstream side from a discharge space with plasma, said apparatus comprising:

at least one pair of electrodes, at least one of said pair of electrodes having a dielectric layer at an outer surface thereof;

a gas supply means for supplying a gas for plasma generation to said discharge space defined between said electrodes wherein said gas supply means provides a flow of the gas for plasma generation from said discharge space toward said object; and a power supply for applying an AC voltage between said electrodes to generate said plasma of the gas for plasma generation in said discharge space; wherein at least one of said pair of electrodes has a curved surface jutting into said discharge space which is configured to spread out said plasma outwardly from said discharge space toward said object.

2. The plasma treatment apparatus as set forth in claim 1, further comprising a plasma guide member disposed adjacent to at least one of said pair of electrodes to guide said plasma such that said plasma spreads out toward said object(s) from said discharge space.

3. The plasma treatment apparatus as set forth in claim 2, wherein said plasma guide member is integrally formed with said electrode.

4. The plasma treatment apparatus as set forth in claim 1, wherein at least one of said pair of electrodes is a tubular electrode.

5. The plasma treatment apparatus as set forth in claim 1, wherein at least one of said pair of electrodes is a cylindrical electrode.

6. The plasma treatment apparatus as set forth in claim 1, wherein said pair of electrodes are a pair of cylindrical electrodes, and arranged such that one of said electrodes extends substantially parallel to the other electrode.

7. The plasma treatment apparatus as set forth in claim 1, wherein a radius of curvature of the curved surface jutting into said discharge space is within a range of 1 to 25 mm.

8. The plasma treatment apparatus as set forth in claim 1, further comprising a coolant supply means for supplying a coolant to the interior of said electrode to reduce an electrode temperature during a plasma treatment.

9. The plasma treatment apparatus as set forth in claim 1, further comprising a control means for maintaining an electrode temperature at a predetermined temperature or less during a plasma treatment.

10. The plasma treatment apparatus as set forth in claim 9, wherein said predetermined temperature is 250° C.

11. The plasma treatment apparatus as set forth in claim 1, wherein a surface roughness of an outer surface of said electrode is within a range of 10 to 1000 μm by arithmetic average roughness.

12. The plasma treatment apparatus as set forth in claim 1, wherein said electrode having said dielectric layer is formed by fusion bonding a glass-based material to an electrode material.

13. The plasma treatment apparatus as set forth in claim 1, wherein said electrode having said dielectric layer is formed by spraying a ceramic material on an electrode material.

14. The plasma treatment apparatus as set forth in claim 1, wherein said dielectric layer is made of a material selected from magnesia and an insulation material containing magnesia.

15. The plasma treatment apparatus as set forth in claim 1, wherein the gas for plasma generation is selected from an inert gas, mixture of inert gases, and a mixture of inert gas and reactive gas.

16. The plasma treatment apparatus as set forth in claim 1, further comprising a conveyer for conveying said object to a position under said electrodes.

17. A plasma treatment apparatus for treating an object placed at a downstream side from discharge spaces with plasmas, said apparatus comprising:

a plurality of pairs of first and second electrodes, at least one of said first and second electrodes having a dielectric layer at an outer surface thereof;

a gas supply means for supplying a gas for plasma generation to said discharge spaces, each of which is defined between adjacent said first and second electrodes; and a power supply for applying an AC voltage between said first and second electrodes to generate said plasmas of the gas for plasma generation in said discharge spaces;

wherein said first and second electrodes are alternately arranged such that each of said first electrodes extends substantially parallel to adjacent said second electrode;

each of said first and second electrodes has a tubular structure; and at least one of adjacent said first and second electrodes has a curved surface jutting into said discharge space.

18. The plasma treatment apparatus according to claim 17, further comprising a coolant supply means for supplying a coolant to interior of said first and second electrodes to reduce an electrode temperature during a plasma treatment.

19. A plasma treatment method performed by use of the plasma treatment apparatus as set forth in claim 1, said method comprising the steps of:

supplying the gas for plasma generation to said discharge space between said electrodes;

applying an AC voltage between said electrodes to generate plasma of the gas for plasma generation in said discharge space under atmospheric pressure; and treating said object with said plasma.

20. A plasma treatment method performed by use of the plasma treatment apparatus as set forth in claim 17, said method comprising the steps of:

supplying the gas for plasma generation to said discharge spaces between said first and second electrodes;

applying an AC voltage between said first and second electrodes to generate plasmas of the gas for plasma generation in said discharge spaces under atmospheric pressure; and treating said object with said plasmas.

* * * * *